US009202983B2

(12) United States Patent
Ni et al.

(10) Patent No.: US 9,202,983 B2
(45) Date of Patent: Dec. 1, 2015

(54) LIGHT-EMITTING DEVICE

(75) Inventors: Ching-Huai Ni, Hsinchu (TW);
Chia-Liang Hsu, Hsinchu (TW);
Yi-Ming Chen, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 568 days.

(21) Appl. No.: 13/421,898

(22) Filed: Mar. 16, 2012

(65) Prior Publication Data
US 2013/0240924 A1 Sep. 19, 2013

(51) Int. Cl.
*H01L 31/12* (2006.01)
*H01L 27/32* (2006.01)
*H01L 33/38* (2010.01)
*H01L 33/22* (2010.01)

(52) U.S. Cl.
CPC .............. *H01L 33/382* (2013.01); *H01L 33/22* (2013.01)

(58) Field of Classification Search
None
See application file for complete search history.

(56) References Cited

U.S. PATENT DOCUMENTS

| | | | |
|---|---|---|---|
| 2008/0251800 A1* | 10/2008 | Bergmann et al. | 257/94 |
| 2009/0050930 A1* | 2/2009 | Yao et al. | 257/103 |
| 2010/0276719 A1 | 11/2010 | Lin et al. | |
| 2011/0117726 A1* | 5/2011 | Pinnington et al. | 438/458 |
| 2011/0220932 A1* | 9/2011 | Katsuno et al. | 257/98 |
| 2011/0233564 A1* | 9/2011 | Shen et al. | 257/79 |

* cited by examiner

*Primary Examiner* — Mohammad Choudhry
(74) *Attorney, Agent, or Firm* — Ditthavong & Steiner, P.C.

(57) ABSTRACT

A light-emitting device comprises a substrate; a semiconductor stack comprising a first type semiconductor layer, a second type semiconductor layer and an active layer formed between the first type semiconductor layer and the second type semiconductor layer; a bonding layer formed between the substrate and the semiconductor stack; and a plurality of buried electrodes physically buried in the first type semiconductor layer.

19 Claims, 8 Drawing Sheets

LIGHT-EMITTING DEVICE

TECHNICAL FIELD

The application relates to a light-emitting device, and more particularly, to a light-emitting device with a plurality of buried electrodes.

DESCRIPTION OF BACKGROUND ART

The light-emitting diode (LED) is a solid state semiconductor device, which has been broadly used as a light-emitting device. The light-emitting device structure comprises a p-type semiconductor layer, an n-type semiconductor layer, and an active layer. The active layer is formed between the p-type semiconductor layer and the n-type semiconductor layer. The structure of the light-emitting device generally comprises III-V group compound semiconductor such as gallium phosphide, gallium arsenide, or gallium nitride. The light-emitting principle of the LED is the transformation of electrical energy to optical energy by applying electrical current to the p-n junction to generate electrons and holes. Then, the LED emits light when the electrons and the holes combine.

FIG. 1A illustrates a conventional light-emitting device 1a. The light-emitting device 1a comprises a substrate 15a; a semiconductor stack 10a comprising a first type semiconductor layer 13a, a second type semiconductor layer 11a and an active layer 12a formed between the first type semiconductor layer 13a and the second type semiconductor layer 11a; a first electrode 18a electrically connected to the first type semiconductor layer 13a; and a second electrode 19a electrically connected to the second type semiconductor layer 11a. The material of the first electrode 18a and the second electrode 19a comprises metal or metal alloy. As illustrated in FIG. 1A, the first electrode 18a is formed on a top surface 17a of the light-emitting device 1a. The electrical current from the first electrode 18a is not dispersed uniformly in the first type semiconductor layer 13a of the light-emitting device 1a.

FIG. 1B illustrates another example of a conventional light-emitting device 1b. The light-emitting device 1b comprises a substrate 15b; a semiconductor stack 10b comprising a first type semiconductor layer 13b, a second type semiconductor layer 11b and an active layer 12b formed between the first type semiconductor layer 13b and the second type semiconductor layer 11b; a first electrode 18b electrically connected to the first type semiconductor layer 13b; a second electrode 19b electrically connected to the second type semiconductor layer 11b; and a conductive layer 16b formed between the first type semiconductor layer 13b and the first electrode 18b. The material of the first electrode 18b and the second electrode 19b comprises metal or metal alloy.

As illustrated in FIG. 1B, the conductive layer 16b is formed on the first type semiconductor layer 13b and the first electrode 18b is formed on a top surface 17b of the conductive layer 16b. The material of the conductive layer 16b comprises thin metal or metal alloy. The conductive layer 16b is used to improve the electrical current spreading. However, the transmittance of the conductive layer 16b is low, and the light emitting efficiency of the light-emitting device 1b is affected.

SUMMARY OF THE APPLICATION

A light-emitting device of an embodiment of the present application comprises a substrate; a semiconductor stack comprising a first type semiconductor layer, a second type semiconductor layer and an active layer formed between the first type semiconductor layer and the second type semiconductor layer; a bonding layer formed between the substrate and the semiconductor stack; a first electrode electrically connected to the first type semiconductor layer; a second electrode electrically connected to the second type semiconductor layer; and a plurality of buried electrodes physically buried in the first type semiconductor layer and electrically connected to the first electrode.

DETAILED DESCRIPTION OF PREFERRED EMBODIMENTS

Figure 1A:
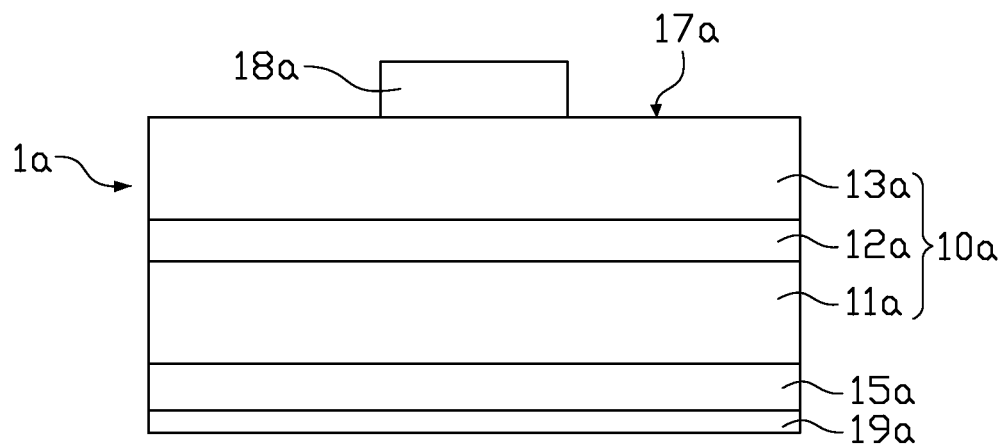
FIG. 1A illustrates a cross-sectional diagram of a conventional light-emitting device.
Figure 1B:
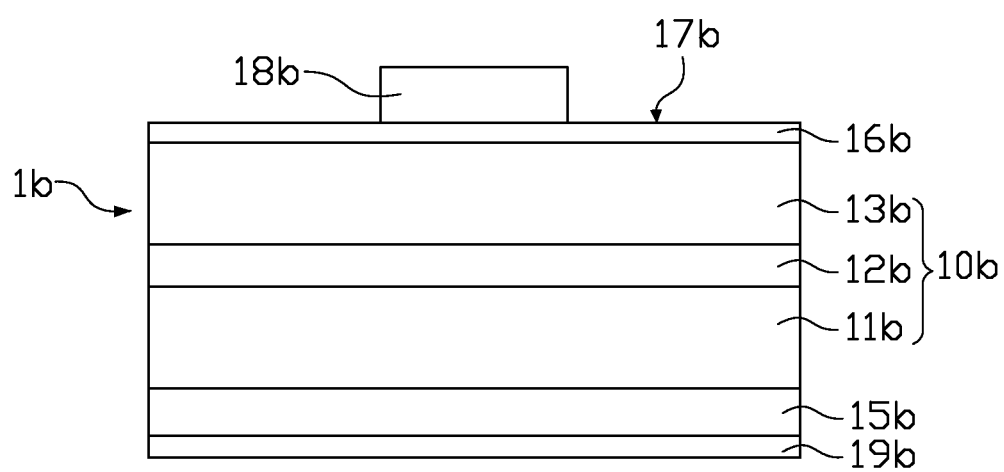
FIG. 1B illustrates a cross-sectional diagram of a conventional light-emitting device.

The embodiment of the application is illustrated in detail, and is plotted in the drawings. The same or the similar part is illustrated in the drawings and the specification with the same number.

Figure 2:
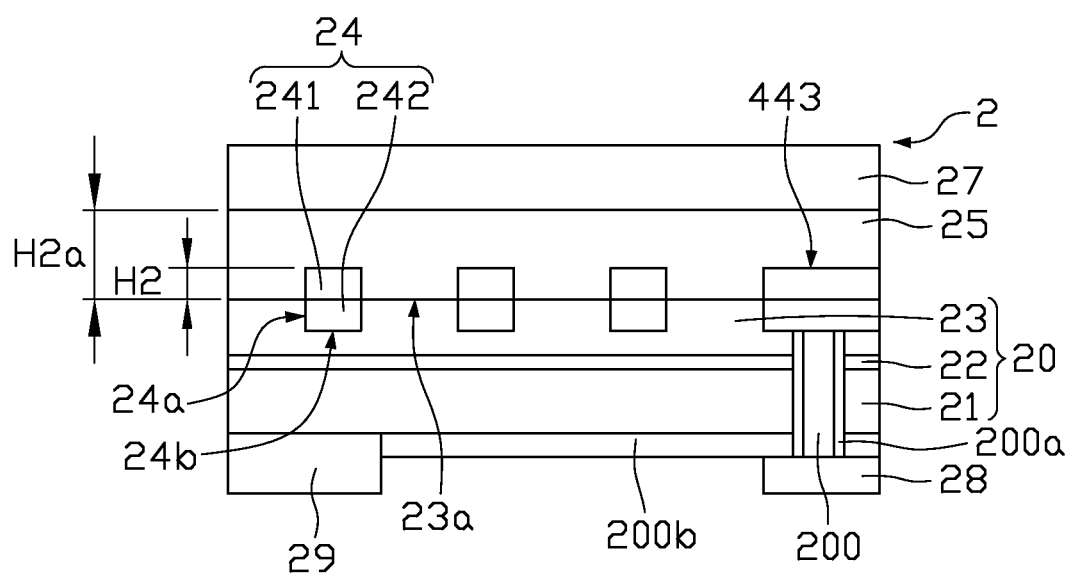
FIG. 2 illustrates a cross-sectional diagram of a light-emitting device according to the first embodiment of the present application.

FIG. 2 illustrates a cross-sectional diagram of a light-emitting device 2 according to the first embodiment of the present application. The light-emitting device 2 comprises a substrate 27; a semiconductor stack 20 comprising a first type semiconductor layer 23, a second type semiconductor layer 21 and an active layer 22 formed between the first type semiconductor layer 23 and the second type semiconductor layer 21; a bonding layer 25 formed between the substrate 27 and the semiconductor stack 20; a first electrode 28 electrically connected to the first type semiconductor layer 23; a second electrode 29 electrically connected to the second type semiconductor layer 21; and a plurality of buried electrodes 24 physically buried in the first type semiconductor layer 23 and electrically connected to the first electrode 28.

The material of the semiconductor stack 20 comprises III-V group based semiconductor material such as InGaN, AlGaAs, or AlGaInP. The semiconductor stack 20 is epitaxially grown on a growth substrate (not shown). The method of forming each layer of the semiconductor stack 20 is not particularly limited. Besides a metal organic chemical vapor deposition method (MOCVD method), each layer of the semiconductor stack 20 may be formed by a known method such as a molecular beam epitaxy method (MBE method), a hydride vapor phase epitaxy method (HVPE method), a sputtering method, an ion-plating method and an electron showering method.

The plurality of buried electrodes 24 buried in the first type semiconductor layer 23 increases the contact area between the buried electrode 24 and the first type semiconductor layer 23. Each of the plurality of the buried electrode 24 electrically connected to each other with an extension electrode (not shown). With the buried electrode 24, the contact area between the buried electrode 24 and the first type semiconductor layer 23 is increased and an electrical current is injected into the first type semiconductor layer 23 uniformly.

A trench 200 is formed in the semiconductor stack 20 by etching process. A sidewall 200a of the trench 200 is insulated from the semiconductor stack 20 with dielectric materials such as $SiO_2$ and $Si_3N_4$. A conductive channel is formed by filling conductive material in the trench 200, wherein the conductive material can be metal or metal alloy, or a transparent conductive material like ITO or ZnO. The materials of the plurality of buried electrodes 24 and the first electrode 28 comprise conductive materials such as metal or metal alloy, and transparent conductive materials such as ITO or ZnO. The materials of the plurality of buried electrodes 24, the first electrode 28 and the trench 200 are the same or different from each other. The plurality of buried electrodes 24 and the first electrode 28 are electrically connected via the conductive channel. The first electrode 28 and the second electrode 29 are formed on the same side of the semiconductor stack 20 opposite to a top surface 23a of the first type semiconductor layer 23. The first electrode 28 and the second electrode 29 are isolated from each other by an isolation layer 200b. The material of the isolation layer 200b comprises dielectric material such as $SiO_2$ and $Si_3N_4$.

As shown in FIG. 2, the substrate 27 is a transparent substrate. A light emitted from the active layer 22 can be emitted out through the transparent substrate 27. The material of the substrate 27 can be sapphire, glass, GaP, ZnSe and SiC. The substrate 27 is attached to the first type semiconductor layer 23 by the bonding layer 25. The material of the bonding layer 25 can be transparent material such as epoxy, polyimide (PI), perfluorocyclobutane (PFCB), benzocyclobutene (BCB), spin-on glass (SOG) and silicone.

When the light-emitting device 2 is operated under a high electrical current, the thickness of the buried electrode 24 is preferred to be thick with a range of about 2~6 μm to reduce the sheet resistance of the light-emitting device 2 and increase the device reliability. As shown in FIG. 2, when the light emitted from the active layer 22 passes through the bonding layer 25, part of the light is absorbed by the bonding layer 25. In order to reduce the thickness H2a of the bonding layer 25, improve the light emission efficiency of the light-emitting device 2 and maintain the thickness of the buried electrode 24 in a range of about 26 μm, the plurality of buried electrodes 24 is buried in the first type semiconductor layer 23. The first type semiconductor layer 23 comprises the top surface 23a and a plurality of recesses 24a. Each of the plurality of recesses 24a comprises a bottom surface 24b lower than the top surface 23a of the first type semiconductor layer 23. The conductive materials such as metal or metal alloy, or the transparent conductive materials such as ITO or ZnO are formed in the plurality of recesses 24a to form the plurality of buried electrodes 24. The conductive materials or the transparent conductive materials can be formed in the plurality of recesses 24a by electron beam evaporation, physical vapor deposition or sputter deposition.

Figure 3A:
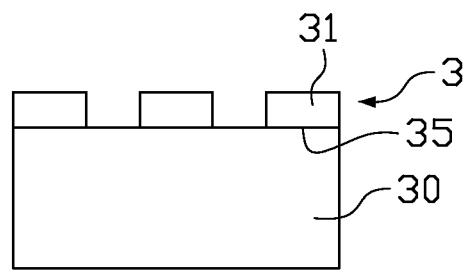
FIGS. 3A to 3D illustrate a process flow for manufacturing the light-emitting device according to an embodiment of the present application.
Figure 3B:
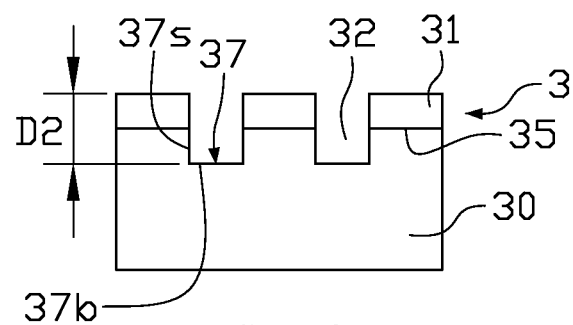
Figure 3C:
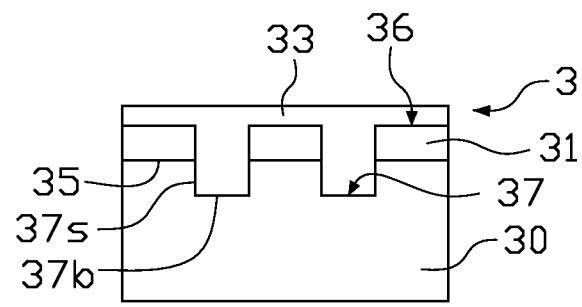
Figure 3D:
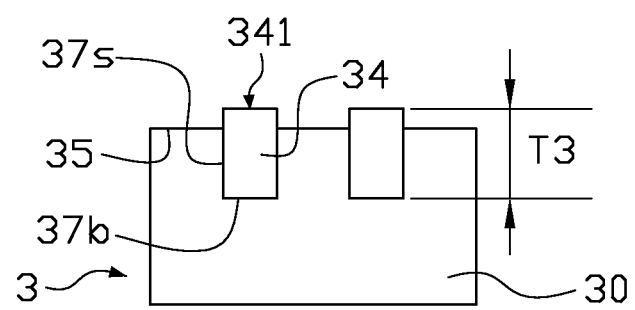

FIGS. 3A-3D illustrate a process flow for manufacturing a light-emitting device 3 according to an embodiment of the present application. As shown in FIGS. 3A-3D, a photoresist layer 31 formed on a top surface 35 of a semiconductor stack 30 is used to define the pattern of a plurality of buried electrodes 34 of the light-emitting device 3 by a conventional lithography process. As shown in FIG. 3B, a plurality of recesses 37 is formed by etching the semiconductor stack 30 through an area 32 not protected by the photoresist layer 31. A depth D2 of each of the plurality of recesses 37 is controlled by dry etching process parameters such as etch time, etchant gas flow rate and etchant gas type. A wet etch process is optionally performed to clean the surface containments of the plurality of recesses 37, and flatten a sidewall surface 37s and a bottom surface 37b of each of the plurality of recesses 37. As shown in FIG. 3C, a conductive material 33 is formed in the plurality of recesses 37 and on a top surface 36 of the photoresist layer 31. The adhesion between the semiconductor stack 30 and the conductive material 33 is improved because of the flat sidewall surface 37s and bottom surface 37b of each of the plurality of recesses 37. As shown in FIG. 3D, the photoresist layer 31 is lifted off by the conventional etch method and the plurality of buried electrodes 34 is buried in the semiconductor stack 30. The thickness T3 of each of the plurality of buried electrodes 34 is controlled by thin-film deposition process such as deposition rate and deposition time. After the pattern definition process and the deposition process as shown in FIGS. 3A-3D are finished, the plurality of buried electrodes 34 comprising an upper surface 341 is formed in the plurality of recesses 37 correspondingly.

As shown in FIG. 2, the plurality of buried electrodes 24 is buried in the first type semiconductor layer 23 by the method illustrated in FIGS. 3A-3D. Each of the plurality of buried electrodes 24 comprises an embedded portion 242 formed under the top surface 23a of the first type semiconductor layer 23 and an exposed portion 241 formed above the top surface 23a of the first type semiconductor layer 23. The embedded portion 242 is physically buried in the first type semiconductor layer 23 and electrically connected to the first type semiconductor layer 23. The thickness H2 of the exposed portion of each of the plurality of buried electrodes 24 is reduced compared with that of the electrode not buried in the first type semiconductor layer. Because the thickness H2 of the exposed portion of each of the plurality of buried electrodes 24 is reduced, the thickness H2a of the bonding layer 25 used to attach the substrate 27 to the semiconductor stack 20 is also reduced.

Figure 4A:
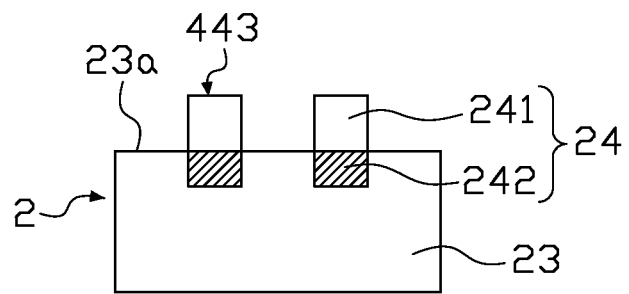
FIGS. 4A to 4C illustrate cross-sectional diagrams of a plurality of buried electrodes in a light-emitting device according to the first embodiment of the present application.
Figure 4B:
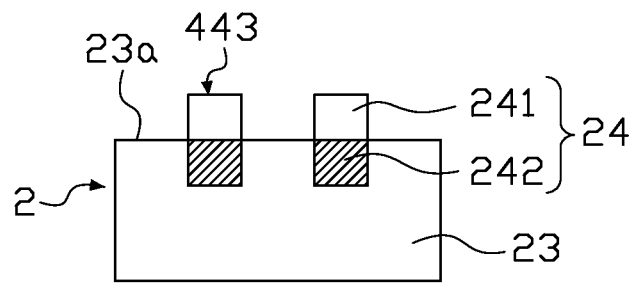
Figure 4C:
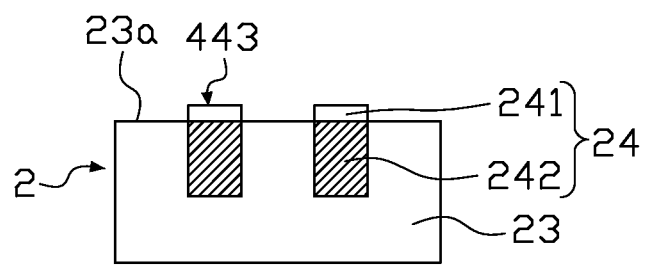

The thickness H2a of the bonding layer 25 is related with the thickness H2 of the exposed portion 241 of each of the plurality of buried electrodes 24. As the thickness H2 of the exposed portion 241 is increased, the thickness H2a of the bonding layer 25 is preferred to be increased to provide adhesion between the substrate 27 and the semiconductor stack 20. FIGS. 4A-4C illustrate different examples of the plurality of buried electrodes 24 in the light-emitting device 2 according to the first embodiment of the present application.

FIG. 4A illustrates an example of a cross-sectional diagram of the plurality of buried electrodes 24 in the light-emitting device 2 according to the first embodiment of the present application. As shown in FIG. 4A, an upper surface 443 of each of the plurality of buried electrodes 24 is higher than the top surface 23a of the first type semiconductor layer 23. Each of the plurality of buried electrodes 24 comprises the embedded portion 242 formed under the top surface 23a of the first type semiconductor layer 23 and the exposed portion 241 formed above the top surface 23a of the first type semiconductor layer 23. The size of the embedded portion 242 is smaller than that of the exposed portion 241.

FIG. 4B illustrates another example of a cross-sectional diagram of the plurality of buried electrodes 24 in the light-emitting device 2 according to the first embodiment of the present application. The size of the embedded portion 242 is equal to that of the exposed portion 241.

FIG. 4C illustrates another example of a cross-sectional diagram of the plurality of buried electrodes 24 in the light-emitting device 2 according to the first embodiment of the present application. The size of the embedded portion 242 is larger than that of the exposed portion 241.

As shown in FIG. 2, in order to increase the light emission efficiency of the light-emitting device 2, the top surface 23a of the first type semiconductor layer 23 can be a non-planar surface such as the one of the cross-sectional diagrams illustrated in FIGS. 5A-5I.

Figure 5A:
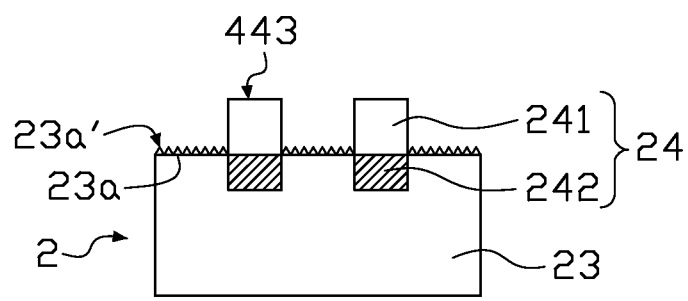
FIGS. 5A to 5I illustrate cross-sectional diagrams of a plurality of buried electrodes in a light-emitting device according to the first embodiment of the present application.

FIG. 5A illustrates an example of a cross-sectional diagram of the plurality of buried electrodes 24 in the light-emitting device 2 according to the first embodiment of the present application. The top surface 23a of the first type semiconductor layer 23 is a non-planar surface. In the present embodiment, the non-planar surface is a roughened surface 23a', and an average roughness of the roughened surface 23a' is greater than 0.05 μm. The light emission efficiency of the light-emitting device 2 illustrated in FIG. 2 is increased by the roughened surface 23a'. As shown in FIG. 5A, the upper surface 443 of each of the plurality of buried electrodes 24 is higher than the roughened surface 23a' of the first type semiconductor layer 23. Each of the plurality of buried electrodes 24 comprises the embedded portion 242 formed under the top surface 23a of the first type semiconductor layer 23 and the exposed portion 241 formed above the top surface 23a of the first type semiconductor layer 23. The embedded portion 242 is physically buried in the first type semiconductor layer 23 and electrically connected to the first type semiconductor layer 23. The size of the embedded portion 242 is smaller than that of the exposed portion 241.

Figure 5B:
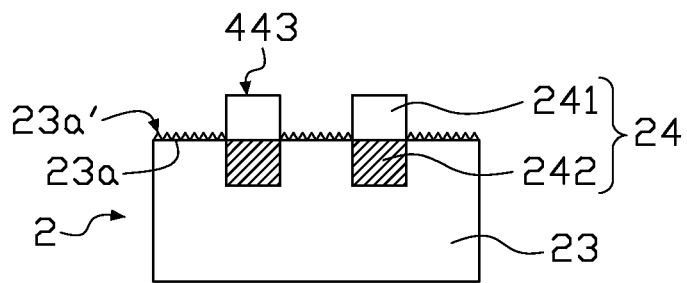

FIG. 5B illustrates another example of a cross-sectional diagram of the plurality of buried electrodes 24 in the light-emitting device 2 according to the first embodiment of the present application. The top surface 23a of the first type semiconductor layer 23 is the non-planar surface. In the present embodiment, the non-planar surface is the roughened surface 23a', and the average roughness of the roughened surface 23a' is greater than 0.05 μm. The light emission efficiency of the light-emitting device 2 is increased by the roughened surface 23a'. As shown in FIG. 5B, the upper surface 443 of each of the plurality of buried electrodes 24 is higher than the roughened surface 23a' of the first type semiconductor layer 23. Each of the plurality of buried electrodes 24 comprises the embedded portion 242 formed under the top surface 23a of the first type semiconductor layer 23 and the exposed portion 241 formed above the top surface 23a of the first type semiconductor layer 23. The embedded portion 242 is physically buried in the first type semiconductor layer 23 and electrically connected to the first type semiconductor layer 23. The size of the embedded portion 242 is equal to that of the exposed portion 241.

Figure 5C:
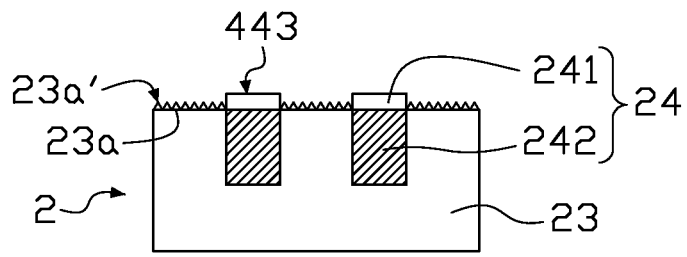

FIG. 5C illustrates another example of a cross-sectional diagram of the plurality of buried electrodes 24 in the light-emitting device 2 according to the first embodiment of the present application. The top surface 23a of the first type semiconductor layer 23 is the non-planar surface. In the present embodiment, the non-planar surface is the roughened surface 23a', and the average roughness of the roughened surface 23a' is greater than 0.05 μm. The light emission efficiency of the light-emitting device 2 is increased by the roughened surface 23a'. As shown in FIG. 5C, the upper surface 443 of each of the plurality of buried electrodes 24 is higher than the roughened surface 23a' of the first type semiconductor layer 23. Each of the plurality of buried electrodes 24 comprises the embedded portion 242 formed under the top surface 23a of the first type semiconductor layer 23 and the exposed portion 241 formed above the top surface 23a of the first type semiconductor layer 23. The embedded portion 242 is physically buried in the first type semiconductor layer 23 and electrically connected to the first type semiconductor layer 23. The size of the embedded portion 242 is larger than that of the exposed portion 241.

When the top surface 23a of the first type semiconductor layer 23 is the roughened surface 23a' and the upper surface 443 of each of the plurality of buried electrodes 24 is higher than the roughened surface 23a' of the first type semiconductor layer 23 as illustrated in FIGS. 5A-5C, the thickness H2a of the bonding layer 25 is determined according to the thickness H2 of the exposed portion 241.

Figure 5D:
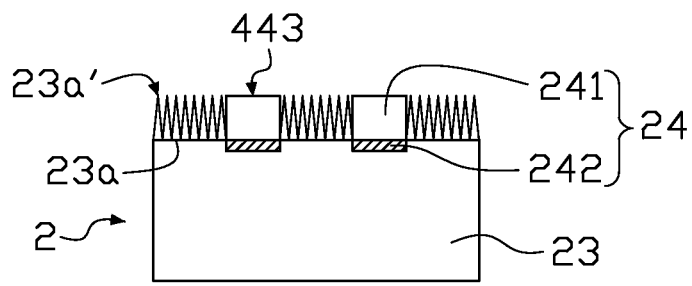

FIG. 5D illustrates another example of a cross-sectional diagram of the plurality of buried electrodes 24 in the light-emitting device 2 according to the first embodiment of the present application. The top surface 23a of the first type semiconductor layer 23 is the non-planar surface. In the present embodiment, the non-planar surface is the roughened surface 23a', and the average roughness of the roughened surface 23a' is greater than 0.05 μm. The light emission efficiency of the light-emitting device 2 is increased by the roughened surface 23a'. As shown in FIG. 5D, the upper surface 443 of each of the plurality of buried electrodes 24 and the roughened surface 23a' of the first type semiconductor layer 23 are substantially on the same plane. Each of the plurality of buried electrodes 24 comprises the embedded portion 242 formed under the top surface 23a of the first type semiconductor layer 23 and the exposed portion 241 formed above the top surface 23a of the first type semiconductor layer 23. The embedded portion 242 is physically buried in the first type semiconductor layer 23 and electrically connected to the first type semiconductor layer 23. The size of the embedded portion 242 is smaller than that of the exposed portion 241.

Figure 5E:
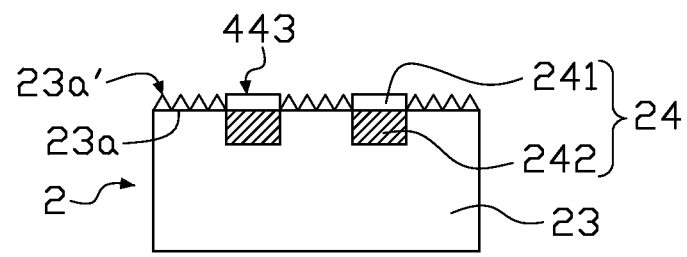

FIG. 5E illustrates another example of a cross-sectional diagram of the plurality of buried electrodes 24 in the light-emitting device 2 according to the first embodiment of the present application. The top surface 23a of the first type semiconductor layer 23 is the non-planar surface. In the present application, the non-planar surface is the roughened surface 23a', and the average roughness of the roughened surface 23a' is greater than 0.05 μm. The light emission efficiency of the light-emitting device 2 is increased by the roughened surface 23a'. As shown in FIG. 5E, the upper surface 443 of each of the plurality of buried electrodes 24 and the roughened surface 23a' of the first type semiconductor layer 23 are substantially on the same plane. Each of the plurality of buried electrodes 24 comprises the embedded portion 242 formed under the top surface 23a of the first type semiconductor layer 23 and the exposed portion 241 formed above the top surface 23a of the first type semiconductor layer 23. The embedded portion 242 is physically buried in the first type semiconductor layer 23 and electrically connected to the first type semiconductor layer 23. The size of the embedded portion 242 is larger than that of the exposed portion 241.

Figure 5F:
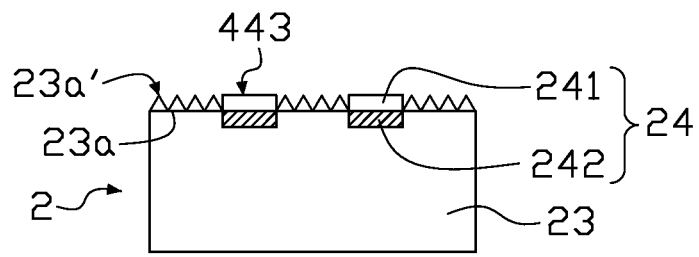

FIG. 5F illustrates another example of a cross-sectional diagram of the plurality of buried electrodes 24 in the light-emitting device 2 according to the first embodiment of the present application. The top surface 23a of the first type semiconductor layer 23 is the non-planar surface. In the present embodiment, the non-planar surface is the roughened surface 23a', and the average roughness of the roughened surface 23a' is greater than 0.05 µm. The light emission efficiency of the light-emitting device 2 is increased by the roughened surface 23a'. As shown in FIG. 5F, the upper surface 443 of each of the plurality of buried electrodes 24 and the roughened surface 23a' of the first type semiconductor layer 23 are substantially on the same plane. Each of the plurality of buried electrodes 24 comprises the embedded portion 242 formed under the top surface 23a of the first type semiconductor layer 23 and the exposed portion 241 formed above the top surface 23a of the first type semiconductor layer 23. The embedded portion 242 is physically buried in the first type semiconductor layer 23 and electrically connected to the first type semiconductor layer 23. The size of the embedded portion 242 is equal to that of the exposed portion 241.

When the top surface 23a of the first type semiconductor layer 23 is the roughened surface 23a', and the upper surface 443 of each of the plurality of buried electrodes 24 and the roughened surface 23a' of the first type semiconductor layer 23 are substantially on the same plane as illustrated in FIGS. 5D-5F, the thickness H2a of the bonding layer 25 is preferred at least larger than 0.05 µm.

Figure 5G:
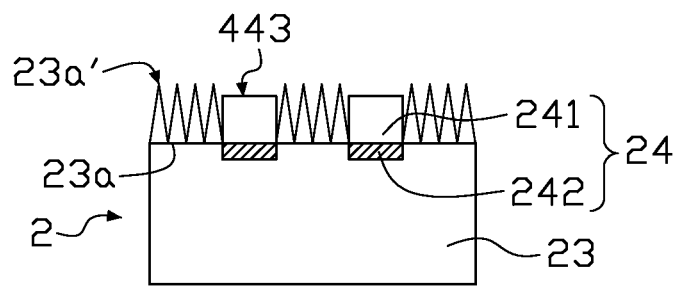

FIG. 5G illustrates another example of a cross-sectional diagram of the plurality of buried electrodes 24 in the light-emitting device 2 according to the first embodiment of the present application. The top surface 23a of the first type semiconductor layer 23 is the non-planar surface. In the present embodiment, the non-planar surface is the roughened surface 23a', and the average roughness of the roughened surface 23a' is greater than 0.05 µm. The light emission efficiency of the light-emitting device 2 is increased by the roughened surface 23a'. As shown in FIG. 5G, the upper surface 443 of each of the plurality of buried electrodes 24 is lower than the roughened surface 23a' of the first type semiconductor layer 23. Each of the plurality of buried electrodes 24 comprises the embedded portion 242 formed under the top surface 23a of the first type semiconductor layer 23 and the exposed portion 241 formed above the top surface 23a of the first type semiconductor layer 23. The embedded portion 242 is physically buried in the first type semiconductor layer 23 and electrically connected to the first type semiconductor layer 23. The size of the embedded portion 242 is smaller than that of the exposed portion 241.

Figure 5H:
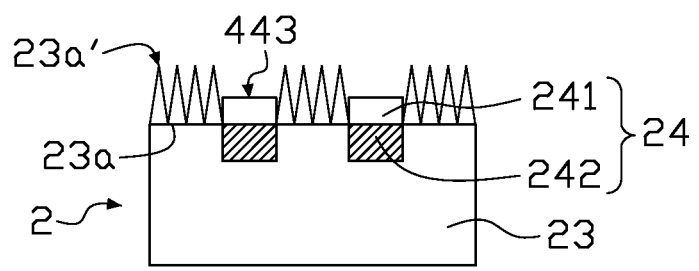

FIG. 5H illustrates another example of a cross-sectional diagram of the plurality of buried electrodes 24 in the light-emitting device 2 according to the first embodiment of the present application. The top surface 23a of the first type semiconductor layer 23 is the non-planar surface. In the present embodiment, the non-planar surface is the roughened surface 23a', and the average roughness of the roughened surface 23a' is greater than 0.05 µm. The light emission efficiency of the light-emitting device 2 is increased by the roughened surface 23a'. As shown in FIG. 5H, the upper surface 443 of each of the plurality of buried electrodes 24 is lower than the roughened surface 23a' of the first type semiconductor layer 23. Each of the plurality of buried electrodes 24 comprises the embedded portion 242 formed under the top surface 23a of the first type semiconductor layer 23 and the exposed portion 241 formed above the top surface 23a of the first type semiconductor layer 23. The embedded portion 242 is physically buried in the first type semiconductor layer 23 and electrically connected to the first type semiconductor layer 23. The size of the embedded portion 242 is equal to that of the exposed portion 241.

Figure 5I:
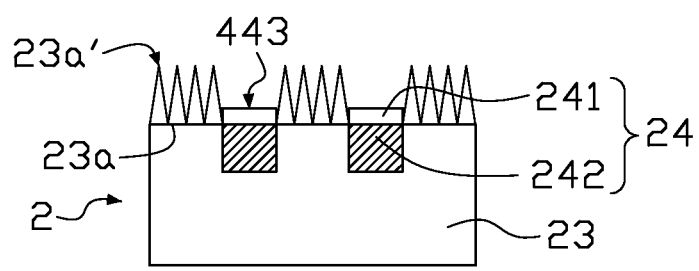

FIG. 5I illustrates another example of a cross-sectional diagram of the plurality of buried electrodes 24 in the light-emitting device 2 according to the first embodiment of the present application. The top surface 23a of the first type semiconductor layer 23 is the non-planar surface. In the present embodiment, the non-planar surface is the roughened surface 23a', and the average roughness of the roughened surface 23a' is greater than 0.05 µm. The light emission efficiency of the light-emitting device 2 is increased by the roughened surface 23a'. As shown in FIG. 5I, the upper surface 443 of each of the plurality of buried electrodes 24 is lower than the roughened surface 23a' of the first type semiconductor layer 23. Each of the plurality of buried electrodes 24 comprises the embedded portion 242 formed under the top surface 23a of the first type semiconductor layer 23 and the exposed portion 241 formed above the top surface 23a of the first type semiconductor layer 23. The embedded portion 242 is physically buried in the first type semiconductor layer 23 and electrically connected to the first type semiconductor layer 23. The size of the embedded portion 242 is larger than that of the exposed portion 241.

When the top surface 23a of the first type semiconductor layer 23 is the roughened surface 23a' and the upper surface 443 of each of the plurality of buried electrodes 24 is lower than the roughened surface 23a' of the first type semiconductor layer 23 as illustrated in FIGS. 5G-5I, the thickness H2a of the bonding layer 25 is preferred at least larger than 0.05 µm.

Figure 6:
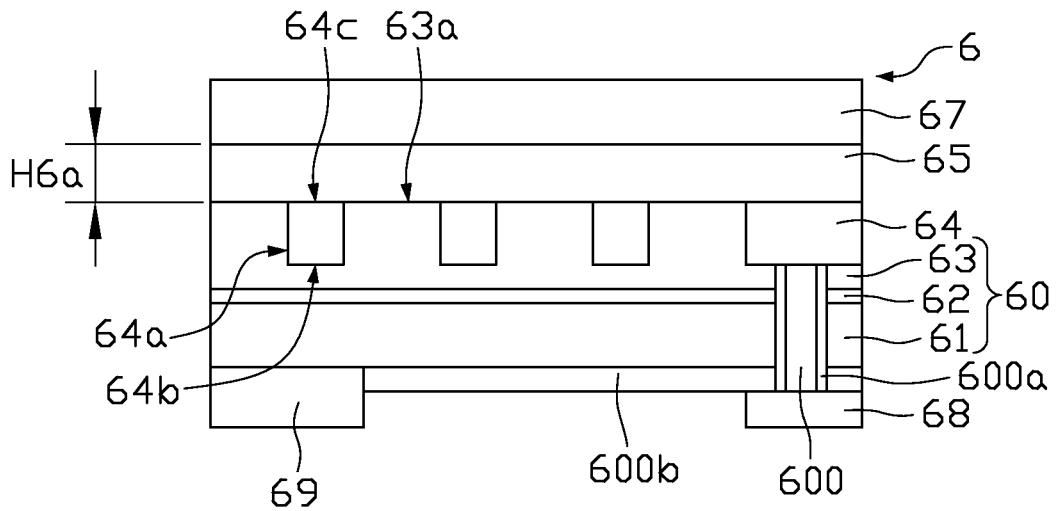
FIG. 6 illustrates a cross-sectional diagram of a light-emitting device according to the second embodiment of the present application.

FIG. 6 illustrates a cross-sectional diagram of a light-emitting device 6 according to the second embodiment of the present application. The light-emitting device 6 comprises a substrate 67; a semiconductor stack 60 comprising a first type semiconductor layer 63, a second type semiconductor layer 61, and an active layer 62 formed between the first type semiconductor layer 63 and the second type semiconductor layer 61; a bonding layer 65 formed between the substrate 67 and the semiconductor stack 60; a first electrode 68 electrically connected to the first type semiconductor layer 63; a second electrode 69 electrically connected to the second type semiconductor layer 61; and a plurality of buried electrodes 64 physically buried in the first type semiconductor layer 63 and electrically connected to the first electrode 68.

The material of the semiconductor stack 60 comprises III-V group based semiconductor material such as InGaN, AlGaAs, or AlGaInP. The semiconductor stack 60 is epitaxially grown on a growth substrate (not shown). The method of forming each layer of the semiconductor stack 60 is not particularly limited. Besides a metal organic chemical vapor deposition method (MOCVD method), each layer of the semiconductor stack 60 may be formed by a known method such as a molecular beam epitaxy method (MBE method), a hydride vapor phase epitaxy method (HVPE method), a sputtering method, an ion-plating method and an electron showering method.

The plurality of buried electrodes 64 buried in the first type semiconductor layer 63 increases the contact area between the buried electrode 64 and the first type semiconductor layer 63. Each of the plurality of the buried electrode 64 electrically connected to each other with an extension electrode (not shown). With the buried electrode 64, the contact area between the buried electrode 64 and the first type semiconductor layer 63 is increased and an electrical current is injected into the first type semiconductor layer 63 uniformly.

A trench 600 is formed in the semiconductor stack 60 by etching process. A sidewall 600a of the trench 600 is insulated from the semiconductor stack 60 with dielectric materials such as $SiO_2$ or $Si_3N_4$. A conductive channel is formed by filling conductive material in the trench 600, wherein the conductive material can be metal or metal alloy, or a transparent conductive material like ITO or ZnO. The materials of the plurality of buried electrodes 64 and the first electrode 68 comprise conductive materials such as metal or metal alloy, and transparent conductive materials such as ITO or ZnO. The materials of the plurality of buried electrodes 64, the first electrode 68 and the trench 600 are the same or different from each other. The plurality of buried electrodes 64 and the first electrode 68 are electrically connected via the conductive channel. In the present embodiment, the first electrode 68 and the second electrode 69 are formed on the same side of the semiconductor stack 60 opposite to a top surface 63a of the first type semiconductor 63. The first electrode 68 and the second electrode 69 are isolated from each other by an isolation layer 600b. The material of the isolation layer 600b comprises dielectric material such as $SiO_2$ or $Si_3N_4$.

As shown in FIG. 6, the substrate 67 is a transparent substrate. A light emitted from the active layer 62 can be emitted out through the transparent substrate 67. The material of the substrate 67 can be sapphire, glass, GaP, ZnSe, and SiC. The substrate 67 is attached to the first type semiconductor layer 63 by the bonding layer 65. The material of the bonding layer 65 can be transparent material such as epoxy, polyimide (PI), perfluorocyclobutane (PFCB), benzocyclobutene (BCB), spin-on glass (SOG) and silicone.

When the light-emitting device 6 is operated under a high electrical current, the thickness of the buried electrode 64 is preferred to be thick with a range of about 2~6 μm to reduce the sheet resistance of the light-emitting device 6 and increase the device reliability. As shown in FIG. 6, when the light emitted from the active layer 62 passes through the bonding layer 65, part of the light is absorbed by the bonding layer 65. In order to reduce the thickness H6a of the bonding layer 65, improve the light emission efficiency of the light-emitting device 6, and maintain the thickness of the buried electrode 64 in a range of about 2~6 μm, the plurality of buried electrodes 64 is buried in the first type semiconductor layer 63. The first type semiconductor layer 63 comprises the top surface 63a and a plurality of recesses 64a. Each of the plurality of recesses 64a comprises a bottom surface 64b lower than the top surface 63a of the first type semiconductor layer 63. The conductive materials such as metal or metal alloy, or the transparent conductive materials such as ITO or ZnO are formed in the plurality of recesses 64a to form the plurality of buried electrodes 64. The conductive materials or the transparent conductive materials can be formed in the plurality of recesses 64a by electron beam evaporation, physical vapor deposition or sputter deposition. The upper surface 64c of each of the plurality of the buried electrodes 64 and the top surface 63a of the first type semiconductor layer 63 are substantially on the same plane.

Figure 7A:
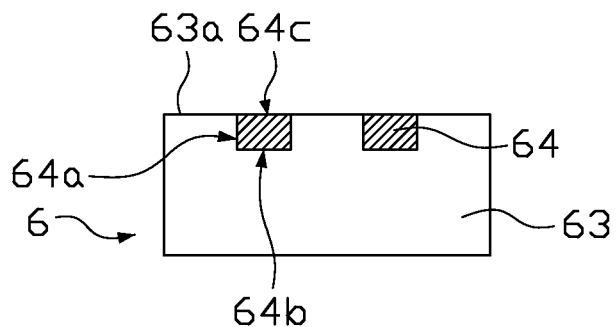
FIGS. 7A to 7B illustrate cross-sectional diagrams of a plurality of buried electrodes in a light-emitting device according to the second embodiment of the present application.

FIG. 7A illustrates an example of a cross-sectional diagram of the plurality of buried electrodes 64 in the light-emitting device 6 according to the second embodiment of the present application. As shown in FIG. 7A, the first type semiconductor layer 63 comprises the top surface 63a and the plurality of recesses 64a. Each of the plurality of recesses 64a comprises the bottom surface 64b lower than the top surface 63a of the first type semiconductor layer 63. The conductive materials such as metal or metal alloy, and the transparent conductive materials such as ITO or ZnO are formed in the plurality of recesses 64a to form the plurality of buried electrodes 64. The upper surface 64c of each of the plurality of buried electrodes 64 and the top surface 63a of the first type semiconductor layer 63 are substantially on the same plane.

Figure 7B:
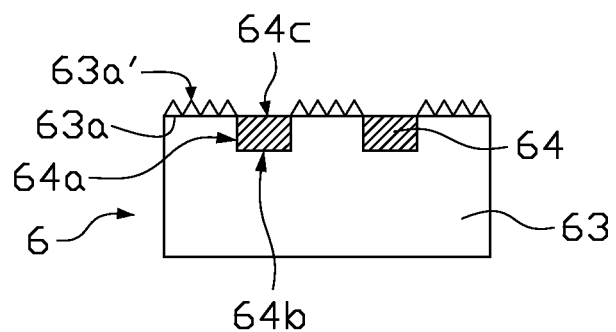

As shown in FIG. 6, in order to increase the light emission efficiency of the light-emitting device 6, the top surface 63a of the first type semiconductor layer 63 can be a non-planar surface as illustrated in FIG. 7B. FIG. 7B illustrates a cross-sectional diagram of the plurality of buried electrodes 64 in the light-emitting device 6 according to the second embodiment of the present application. As shown in FIG. 7B, the first type semiconductor layer 63 comprises the top surface 63a and the plurality of recesses 64a. The top surface 63a is a non-planar surface. The non-planar surface is a roughened surface 63a' and an average roughness of the roughened surface is greater than 0.05 μm. The light emission efficiency of the light-emitting device 6 is increased by the roughened surface 63a'. Each of the plurality of recesses 64a comprises the bottom surface 64b lower than the top surface 63a of the first type semiconductor layer 63. The conductive materials such as metal or metal alloy, and the transparent conductive materials such as ITO or ZnO are formed in the plurality of recesses 64a to form the plurality of buried electrodes 64. The upper surface 64c of each of the plurality of the buried electrodes 64 is lower than the roughened surface 63a' of the first type semiconductor layer 63.

As shown in FIG. 6, the plurality of buried electrodes 64 is totally buried in the first type semiconductor layer 63. The top surface 63a of the first type semiconductor layer 63 and the upper surface 64c of each of the plurality of the buried electrode 64 are substantially on the same plane. In the second embodiment illustrated in FIG. 6, the plurality of buried electrodes 64 is totally buried in the first type semiconductor layer 63 and there is no exposed portion of each of the plurality of buried electrodes 64. Thus, the thickness H6a of the bonding layer 65 used to attach the substrate 67 to the semiconductor stack 60 is reduced.

Figure 8:
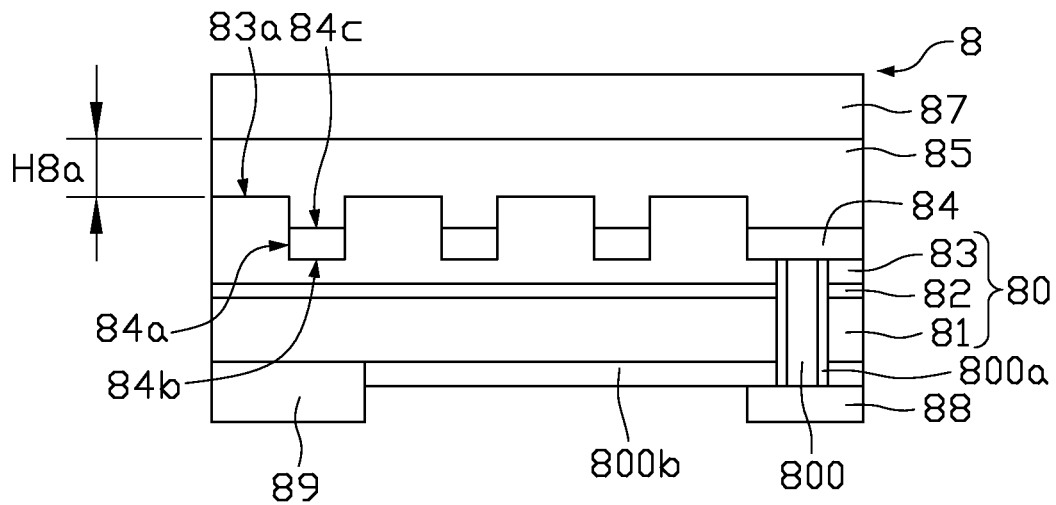
FIG. 8 illustrates a cross-sectional diagram of a light-emitting device according to the third embodiment of the present application.

FIG. 8 illustrates a cross-sectional diagram of a light-emitting device 8 according to the third embodiment of the present application. The light-emitting device 8 comprises a substrate 87; a semiconductor stack 80 comprising a first type semiconductor layer 83, a second type semiconductor layer 81, and an active layer 82 formed between the first type semiconductor layer 83 and the second type semiconductor layer 81; a bonding layer 85 formed between the substrate 87 and the semiconductor stack 80; a first electrode 88 electrically connected to the first type semiconductor layer 83; a second electrode 89 electrically connected to the second type semiconductor layer 81; and a plurality of buried electrodes 84 physically buried in the first type semiconductor layer 83 and electrically connected to the first electrode 88.

The material of the semiconductor stack 80 comprises III-V group based semiconductor material such as InGaN, AlGaAs, or AlGaInP. The semiconductor stack 80 is epitaxially grown on a growth substrate (not shown). The method of forming each layer of the semiconductor stack 80 is not particularly limited. Besides a metal organic chemical vapor deposition method (MOCVD method), each layer of the semiconductor stack 80 may be formed by a known method such as a molecular beam epitaxy method (MBE method), a hydride vapor phase epitaxy method (HVPE method), a sputtering method, an ion-plating method and an electron showering method.

The plurality of buried electrodes 84 buried in the first type semiconductor layer 83 increases the contact area between the buried electrode 84 and the first type semiconductor layer 83. Each of the plurality of the buried electrode 84 electrically connected to each other with an extension electrode (not shown). With the buried electrode 84, the contact area between the buried electrode 84 and the first type semiconductor layer 83 is increased and an electrical current is injected into the first type semiconductor layer 83 uniformly.

A trench 800 is formed in the semiconductor stack 80 by etching process. A sidewall 800a of the trench 800 is insulated from the semiconductor stack 80 with dielectric materials such as $SiO_2$ or $Si_3N_4$. A conductive channel is formed by filling conductive material in the trench 800, wherein the conductive material can be metal or metal alloy, or a transparent conductive material like ITO or ZnO. The materials of the plurality of buried electrodes 84 and the first electrode 88 comprise conductive materials such as metal or metal alloy, and transparent conductive materials such as ITO or ZnO. The materials of the plurality of buried electrodes 84, the first electrode 88 and the trench 800 are the same or different from each other. The plurality of buried electrodes 84 and the first electrode 88 are electrically connected via the conductive channel. The first electrode 88 and the second electrode 89 are formed on the same side of the semiconductor stack 80 opposite to a top surface 83a of the first type semiconductor 83. The first electrode 88 and the second electrode 89 are isolated from each other by an isolation layer 800b. The material of the isolation layer 800b comprises dielectric material such as $SiO_2$ or $Si_3N_4$.

As shown in FIG. 8, the substrate 87 is a transparent substrate. A light emitted from the active layer 82 can be emitted out through the transparent substrate 87. The material of the substrate 87 can be sapphire, glass, GaP, ZnSe, and SiC. The substrate 87 is attached to the first type semiconductor layer 83 by the bonding layer 85. The material of the bonding layer 85 can be transparent material such as epoxy, polyimide (PI), perfluorocyclobutane (PFCB), benzocyclobutene (BCB), spin-on glass (SOG) and silicone.

When the light-emitting device 8 is operated under a high electrical current, the thickness of the buried electrode 84 is preferred to be thick with a range of about 2~6 μm to reduce the sheet resistance of the light-emitting device 8 and increase the device reliability. As shown in FIG. 8, when the light emitted from the active layer 82 passes through the bonding layer 85, part of the light is absorbed by the bonding layer 85. In order to reduce the thickness H8a of the bonding layer 85, improve the light emission efficiency of the light-emitting device 8, and maintain the thickness of the buried electrode 84 in a range of about 2~6 μm, the plurality of buried electrodes 84 is buried in the first type semiconductor layer 83. The first type semiconductor layer 83 comprises the top surface 83a and a plurality of recesses 84a. Each of the plurality of recesses 84a comprises a bottom surface 84b lower than the top surface 83a of the first type semiconductor layer 83. The conductive materials such as metal or metal alloy, or the transparent conductive materials such as ITO or ZnO are formed in the plurality of recesses 84a to form the plurality of buried electrodes 84. The conductive materials or the transparent conductive materials can be formed in the plurality of recesses 84a by electron beam evaporation, physical vapor deposition or sputter deposition. The upper surface 84c of the buried electrode 84 is lower than the top surface 83a of the first type semiconductor layer 83.

Figure 9A:
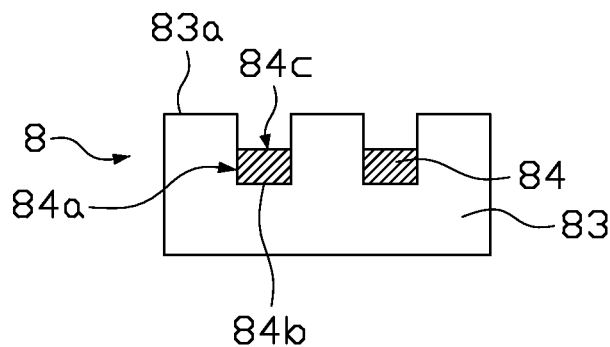
FIGS. 9A to 9B illustrate cross-sectional diagrams of a plurality of buried electrodes in a light-emitting device according to the third embodiment of the present application.

The plurality of buried electrodes 84 is buried in the first type semiconductor layer 83. FIG. 9A illustrates a cross-sectional diagram of the plurality of buried electrodes 84 in the light-emitting device 8 according to the third embodiment of the present application. As shown in FIG. 9A, the first type semiconductor layer 83 comprises the top surface 83a and the plurality of recesses 84a. Each of the plurality of recesses 84a comprises the bottom surface 84b lower than the top surface 83a of the first type semiconductor layer 83. The conductive materials such as metal or metal alloy, and the transparent conductive materials such as ITO or ZnO are formed in the plurality of recesses 84a to form the plurality of buried electrodes 84. The upper surface 84c of the buried electrode 84 is lower than the top surface 83a of the first type semiconductor layer 83.

Figure 9B:
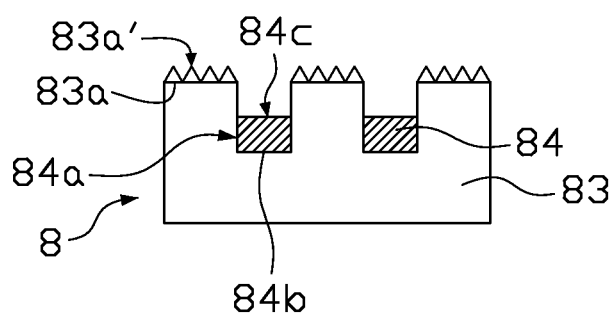

As shown in FIG. 8, in order to increase the light emission efficiency of the light-emitting device 8, the top surface 83a of the first type semiconductor layer 83 can be a non-planar surface as illustrated in FIG. 9B. FIG. 9B illustrates a cross-sectional diagram of the plurality of buried electrodes 84 in the light-emitting device 8 according to the third embodiment of the present application. As shown in FIG. 9B, the first type semiconductor layer 83 comprises the top surface 83a and the plurality of recesses 84a. The top surface 83a is a non-planar surface. The non-planar surface is a roughened surface 83a' and an average roughness of the roughened surface 83a' is greater than 0.05 μm. The light emission efficiency of the light-emitting device 8 is increased by the roughened surface 83a'. Each of the plurality of recesses 84a comprises the bottom surface 84b lower than the top surface 83a of the first type semiconductor layer 83. The conductive materials such as metal or metal alloy, and the transparent conductive materials such as ITO or ZnO are formed in the plurality of recesses 84a to form the plurality of buried electrodes 84. The upper surface 84c of each of the plurality of the buried electrode 84 is lower than the roughened surface 83a' of the first type semiconductor layer 83.

As shown in FIG. 8, the plurality of buried electrodes 84 is totally buried in the first type semiconductor layer 83. The upper surface 84c of the buried electrode 84 is lower than the top surface 83a of the first type semiconductor layer 83. In the third embodiment illustrated in FIG. 8, the plurality of buried electrodes 84 is totally buried in the first type semiconductor layer 83 and there is no exposed portion of each of the plurality of buried electrodes 84. Thus, the thickness H8a of the bonding layer 85 used to attach the substrate 87 to the semiconductor stack 80 is reduced.

The principle and the efficiency of the present application illustrated by the embodiments above are not the limitation of the application. Any person having ordinary skill in the art can modify or change the aforementioned embodiments. Therefore, the protection range of the rights in the application will be listed as the following claims.

What is claimed is:

1. A light-emitting device, comprising:
a substrate;
a semiconductor stack comprising a first type semiconductor layer, a second type semiconductor layer and an active layer formed between the first type semiconductor layer and the second type semiconductor layer, wherein the first type semiconductor layer comprises a top surface;
wherein the top surface is a non-planar roughened surface;
a bonding layer formed between the substrate and the semiconductor stack;
a plurality of recesses comprising a bottom surface lower than the non-planar roughened surface; and
a plurality of buried electrodes physically buried in and electrically connected to the first type semiconductor layer, wherein the plurality of buried electrodes comprising an upper surface is formed in the plurality of recesses respectively, and the upper surface of the buried electrode is lower than the top surface of the first type semiconductor layer.

2. The light-emitting device according to claim 1, wherein the non-planar roughened surface has an average roughness greater than 0.05 μm.

3. The light-emitting device according to claim 1, wherein the material of each of the plurality of buried electrodes comprises metal or metal alloy.

4. The light-emitting device according to claim 1, wherein the material of the bonding layer comprises transparent materials.

5. The light-emitting device according to claim 1, wherein the substrate is a transparent substrate.

6. A light-emitting device comprising:
   a substrate;
   a semiconductor stack comprising a first type semiconductor layer, a second type semiconductor layer and an active layer formed between the first type semiconductor layer and the second type semiconductor layer;
   a bonding layer formed between the substrate and the semiconductor stack;
   a plurality of buried electrodes physically buried in and electrically connected to the first type semiconductor layer;
   a trench formed in the semiconductor stack, wherein the trench is filled with conductive material; and
   a first electrode electrically connected to the first type semiconductor layer and a second electrode electrically connected to the second type semiconductor layer, wherein the plurality of buried electrodes and the first electrode arc electrically connected through the trench.

7. The light-emitting device according to claim 6, further comprising a plurality of recesses formed in the first type semiconductor layer, wherein the first type semiconductor layer comprises a top surface and the plurality of recesses comprises a bottom surface lower than the top surface, the plurality of buried electrodes comprising an upper surface is formed in the plurality of recesses respectively.

8. The light-emitting device according to claim 7, wherein the upper surface of the buried electrode is higher than the top surface of the first type semiconductor layer.

9. The light-emitting device according to claim 7, wherein each of the plurality of buried electrodes comprises an embedded portion formed under the top surface of the first type semiconductor layer and an exposed portion formed above the top surface of the first type semiconductor layer.

10. The light-emitting device according to claim 9, wherein the size of the embedded portion is larger than that of the exposed portion.

11. The light-emitting device according to claim 9, wherein the size of the embedded portion is equal to that of the exposed portion.

12. The light-emitting device according to claim 9, wherein the size of the embedded portion is smaller than that of the exposed portion.

13. The light-emitting device according to claim 6, wherein the first type semiconductor layer comprises a top surface, and the top surface is a roughened surface.

14. The light-emitting device according to claim 13, wherein an average roughness of the roughened surface is greater than 0.05 μm.

15. The light-emitting device according to claim 13, wherein the plurality of buried electrodes comprises an upper surface lower than the roughened surface of the first type semiconductor layer.

16. The light-emitting device according to claim 13, wherein the plurality of buried electrodes comprising an upper surface higher than the roughened surface of the first type semiconductor layer.

17. The light-emitting device according to claim 7, wherein the upper surface of the buried electrode and the top surface of the first type semiconductor layer are substantially on the same plane.

18. The light-emitting device according to claim 7, wherein the upper surface of the buried electrode is lower than the top surface of the first type semiconductor layer.

19. The light-emitting device according to claim 6, wherein the material of each of the plurality of buried electrodes comprises metal or metal alloy.

* * * * *